(12) United States Patent
Yoshino

(10) Patent No.: US 9,997,392 B2
(45) Date of Patent: Jun. 12, 2018

(54) WAFER PROCESSING METHOD

(71) Applicant: DISCO CORPORATION, Tokyo (JP)

(72) Inventor: Tomoki Yoshino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days. days.

(21) Appl. No.: 15/440,867

(22) Filed: Feb. 23, 2017

(65) Prior Publication Data

US 2017/0250102 A1 Aug. 31, 2017

(30) Foreign Application Priority Data

Feb. 25, 2016 (JP) ................. 2016-034426

(51) Int. Cl.
| | | |
|---|---|---|
| *H01L 21/683* | (2006.01) | |
| *H01L 21/268* | (2006.01) | |
| *H01L 21/78* | (2006.01) | |
| *H01L 23/544* | (2006.01) | |
| *B23K 26/364* | (2014.01) | |

(Continued)

(52) U.S. Cl.
CPC ........ *H01L 21/6836* (2013.01); *B23K 26/364* (2015.10); *B23K 26/402* (2013.01); *B23K 26/53* (2015.10); *H01L 21/268* (2013.01); *H01L 21/78* (2013.01); *H01L 23/544* (2013.01); *H01L 2221/6834* (2013.01); *H01L 2221/68318* (2013.01); *H01L 2221/68327* (2013.01); *H01L 2221/68386* (2013.01); *H01L 2223/5446* (2013.01)

(58) Field of Classification Search
CPC . H01L 21/78; H01L 21/836; H01L 21/67132; H01L 21/3043; H01L 21/6835; H01L 2221/68327; H01L 21/6836; H01L 21/268; H01L 2223/5446; H01L 23/544; B23K 26/364; B23K 26/53; B23K 26/402
See application file for complete search history.

(56) References Cited

U.S. PATENT DOCUMENTS

| | | | |
|---|---|---|---|
| 2007/0080450 A1* | 4/2007 | Kuan ...................... | H01L 22/20 257/737 |
| 2007/0170159 A1* | 7/2007 | Fukumitsu ............. | B23K 26/03 219/121.69 |

(Continued)

FOREIGN PATENT DOCUMENTS

| | | |
|---|---|---|
| JP | 10-305420 | 11/1998 |
| JP | 2002-192370 | 7/2002 |
| JP | 2014-221483 | 11/2014 |

*Primary Examiner* — Caridad Everhart
(74) *Attorney, Agent, or Firm* — Greer Burns & Crain, Ltd.

(57) ABSTRACT

In a wafer processing method, the back side of a wafer is attached to an adhesive tape supported at its peripheral portion by an annular frame having an inside opening. The wafer is set in the inside opening, thereby supporting the wafer through the adhesive tape to the annular frame. The wafer is held on a chuck table with the front side of the wafer facing the upper surface of the chuck table. A laser beam is applied through the adhesive tape and the back side of the wafer in an area corresponding to each division line, thereby forming a plurality of shield tunnels arranged along each division line. Each shield tunnel extends from the front side of the wafer to the back side thereof, each shield tunnel being composed of a fine hole and an amorphous region formed around the fine hole for shielding the fine hole.

8 Claims, 4 Drawing Sheets

(51) Int. Cl.
*B23K 26/402* (2014.01)
*B23K 26/53* (2014.01)

(56) References Cited

U.S. PATENT DOCUMENTS

| | | | |
|---|---|---|---|
| 2010/0012633 A1* | 1/2010 | Atsumi | C03B 33/0222 219/121.72 |
| 2014/0334511 A1* | 11/2014 | Takeda | H01S 3/10 372/41 |
| 2015/0079761 A1* | 3/2015 | Lei | H01L 21/78 438/462 |
| 2015/0332910 A1* | 11/2015 | Morikazu | H01L 21/02013 438/798 |

* cited by examiner

WAFER PROCESSING METHOD

BACKGROUND OF THE INVENTION

Field of the Invention

The present invention relates to a wafer processing method for dividing a wafer into individual device chips along a plurality of crossing division lines by applying a laser beam to the wafer, the front side of the wafer being partitioned by the division lines to define a plurality of separate regions where a plurality of devices corresponding to the device chips are formed.

Description of the Related Art

A plurality of devices such as integrated circuits (ICs), large-scale integrations (LSIs), and light-emitting diodes (LEDs) are formed on the front side of a wafer so as to be separated from each other by a plurality of division lines. The wafer thus having the devices on the front side is divided into individual device chips by a laser processing apparatus. The device chips thus obtained are used in electrical equipment such as mobile phones, personal computers, and illumination equipment (see Japanese Patent Laid-open No. Hei 10-305420, for example). The laser processing apparatus is composed generally of a chuck table for holding a workpiece, laser beam applying means having focusing means for applying a laser beam to the workpiece held on the chuck table, and feeding means for relatively feeding the chuck table and the laser beam applying means, whereby the laser beam is applied along each division line formed on a wafer as the workpiece with high accuracy, thereby dividing the wafer along each division line.

Further, in general, a laser processing apparatus is classified into a type such that a laser beam having an absorption wavelength to the workpiece is applied to perform ablation as described in Japanese Patent Laid-open No. Hei 10-305420 and a type such that a laser beam having a transmission wavelength to the workpiece is applied in the condition where the focal point of the laser beam is set inside the workpiece, thereby forming a modified layer (see Japanese Patent No. 3408805, for example). In either type, however, the laser beam must be applied plural times (in plural passes) along each division line, so as to completely cut the wafer, causing a reduction in productivity.

To cope with this problem, the present applicant has developed and proposed a technique of forming a plurality of shield tunnels along each division line, wherein each shield tunnel extends from the front side of a wafer to the back side thereof, and each shield tunnel is composed of a fine hole and an amorphous region surrounding the fine hole (see Japanese Patent Laid-open No. 2014-221483, for example), thereby improving the production efficiency.

SUMMARY OF THE INVENTION

According to the technique described in Japanese Patent Laid-open No. 2014-221483, the plural shield tunnels can be formed along each division line of the wafer in such a manner that each shield tunnel extends from the front side of the wafer to the back side thereof. Accordingly, it is unnecessary to apply a laser beam plural times along each division line, so that the wafer can be efficiently divided into individual devices. There is a case that projecting bumps (electrodes) are formed on each device adjacent to each division line formed on the front side of the wafer. In the case that such bumps are present on each device, there is a problem such that when the focal point of the laser beam for forming the shield tunnels is set at a deep position from the front side of the wafer, the bumps may interfere with a part of the outer portion of the laser beam depending on the numerical aperture of a focusing lens included in the laser beam applying means, so that desired shield tunnels cannot be formed. Such a problem may arise not only in the above case that the bumps are formed on each device, but also in the case that a test element group (TEG) is formed on each division line.

In the case of applying a laser beam to the wafer so as to avoid the interference with the bumps or TEG formed on the front side of the wafer, thereby forming the shield tunnels, it is considered that the front side of the wafer is attached to an adhesive tape supported to an annular frame and the laser beam is then applied to the back side of the wafer as the technique described in Japanese Patent Laid-open No. 2014-221483. In this case, the wafer supported through the adhesive tape to the annular frame is set on a chuck table in a laser processing apparatus, wherein the annular frame has an inside opening and the adhesive tape is supported at its peripheral portion to the annular frame so as to close the inside opening of the annular frame. The front side of the wafer on which the devices are formed is attached to the front side (adhesive side) of the adhesive tape, and the wafer is set on the chuck table in the condition where the back side of the wafer is oriented upward, or exposed. However, in this case, the front side of the wafer is held through the adhesive tape on the chuck table in performing laser processing. Accordingly, in the subsequent step such as die bonding step and wire bonding step, the front side of the wafer on which the devices are formed must be oriented upward. After dividing the wafer into individual device chips, each device chip is picked up from the adhesive tape in the condition where the front side of each device chip is oriented downward. Accordingly, a step of inverting each device chip is necessary, causing a reduction in productivity.

It is therefore an object of the present invention to provide a wafer processing method for dividing a wafer into individual device chips along a plurality of division lines by applying a laser beam to the wafer, the front side of the wafer being partitioned by the division lines to define a plurality of separate regions where a plurality of devices are formed, wherein even when any interference such as bumps and TEG is present on the front side of the wafer, shield tunnels can be efficiently formed along each division line without reducing the working efficiency in the subsequent step.

In accordance with an aspect of the present invention, there is provided a wafer processing method for dividing a wafer into individual device chips along a plurality of crossing division lines, the front side of the wafer being partitioned by the division lines to define a plurality of separate regions where a plurality of devices corresponding to the device chips are formed, the wafer processing method including a frame supporting step of attaching the back side of the wafer to an adhesive tape supported at its peripheral portion to an annular frame having an inside opening in such a manner that the wafer is set in the inside opening closed by the adhesive tape, thereby supporting the wafer through the adhesive tape to the annular frame; and a shield tunnel forming step of holding the wafer on a chuck table in the condition where the front side of the wafer faces the upper surface of the chuck table after performing the frame supporting step, and next applying a laser beam through the adhesive tape to the back side of the wafer in an area corresponding to each division line, the laser beam having a transmission wavelength to the wafer and the adhesive tape, thereby forming a plurality of shield tunnels arranged along each division line, each shield tunnel extending from the front side of the wafer to the back side thereof, each shield tunnel being composed of a fine hole and an amorphous region formed around the fine hole for shielding the fine hole.

Preferably, the shield tunnel forming step is followed by a dividing step of expanding the adhesive tape to thereby divide the wafer into the individual device chips. Preferably, a protective member is provided on the front side of the wafer before holding the wafer on the chuck table, and this protective member is peeled from the front side of the wafer before expanding the adhesive tape in the dividing step.

According to the present invention, the following effects can be exhibited. Even in the case that projecting bumps (electrodes) are provided on each device adjacent to each division line formed on the front side of the wafer or any interference such as TEG is formed on each division line, the shield tunnels can be efficiently formed along each division line without being affected by the bumps or interference.

Furthermore, after dividing the wafer into the individual device chips, each device chip can be picked up in the condition where the front side of the wafer on which the devices are formed is oriented upward, or exposed. Accordingly, in performing the next step, it is unnecessary to invert each device chip, so that the wafer can be processed without reducing the production efficiency.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
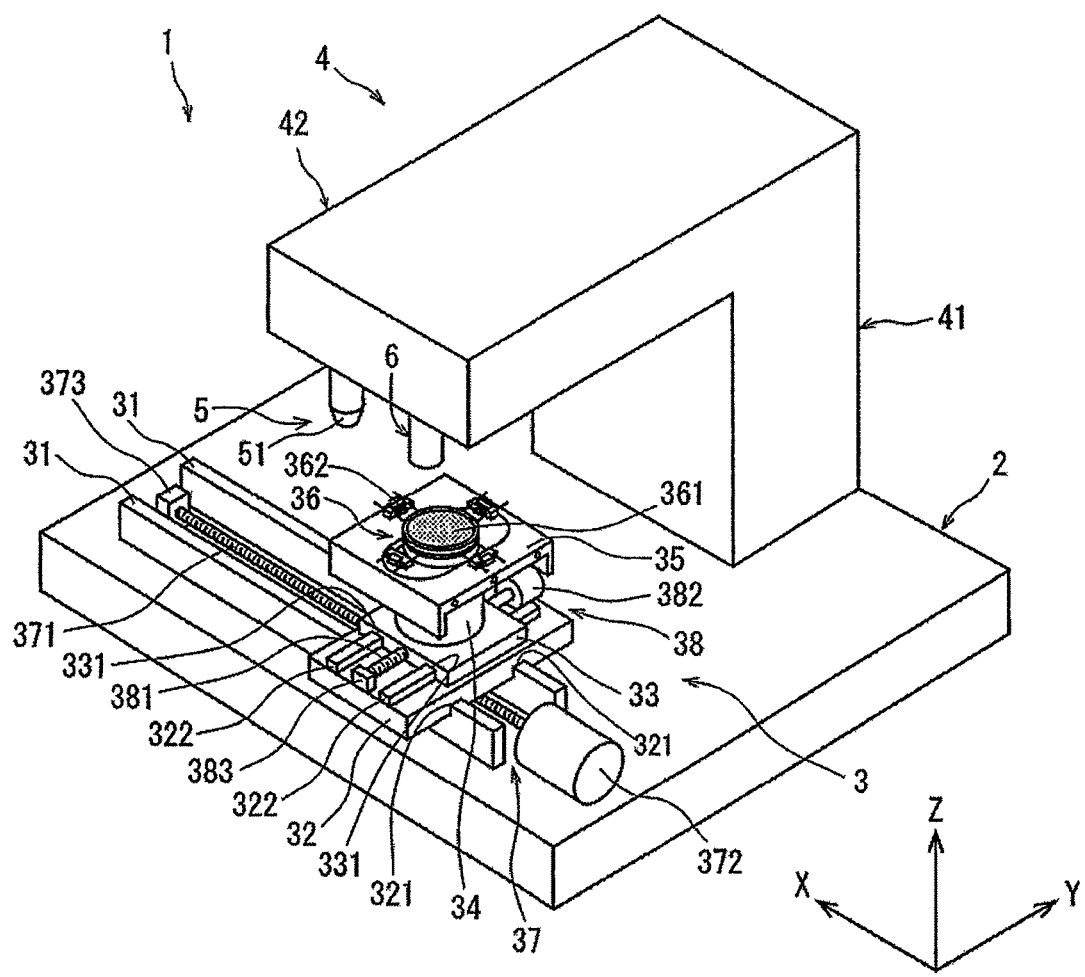
FIG. 1 is a general perspective view of a laser processing apparatus.

A preferred embodiment of the wafer processing method according to the present invention will now be described in detail with reference to the attached drawings. FIG. 1 is a perspective view of a laser processing apparatus 1 for performing the wafer processing method according to the present invention. The laser processing apparatus 1 shown in FIG. 1 includes a stationary base 2, a chuck table mechanism 3 for holding a workpiece, the chuck table mechanism 3 being provided on the stationary base 2 so as to be movable in the direction (X direction) shown by an arrow X, and a laser beam applying unit 4 provided on the stationary base 2. The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the direction (Y direction) shown by an arrow Y perpendicular to the X direction, a cover table 35 supported by a cylindrical member 34 standing on the second slide block 33, and a chuck table 36 as holding means for holding a workpiece. The chuck table 36 has a vacuum chuck 361 formed of a porous material. A workpiece such as a wafer is adapted to be held under suction on the upper surface of the vacuum chuck 361 as a holding surface by operating suction means (not shown). The chuck table 36 is rotatable by a pulse motor (not shown) provided in the cylindrical member 34. The chuck table 36 is provided with clamps 362 for fixing an annular frame supporting a workpiece through a protective tape to be hereinafter described.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes X moving means 37 for moving the first slide block 32 in the X direction along the guide rails 31. The X moving means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The laser processing apparatus 1 includes X position detecting means (not shown) for detecting the X position of the chuck table 36. The X position detecting means includes a linear scale (not shown) extending along one of the guide rails 31 and a read head (not shown) provided on the first slide block 32 and movable along the linear scale together with the first slide block 32. The read head of the X position detecting means transmits a pulse signal of one pulse every 1 μm in this preferred embodiment to control means which will be hereinafter described. The control means counts the number of pulses as the pulse signal input from the read head to thereby detect the X position of the chuck table 36. In the case that the pulse motor 372 is used as the drive source for the X moving means 37 as in this preferred embodiment, the number of pulses as a drive signal output from the control means to the pulse motor 372 may be counted by the control means to thereby detect the X position of the chuck table 36. In the case that a servo motor is used as the drive source for the X moving means 37, a pulse signal output from a rotary encoder for detecting the rotational speed of the servo motor may be sent to the control means, and the number of pulses as the pulse signal input from the rotary encoder into the control means may be counted by the control means to thereby detect the X position of the chuck table 36. Thus, the means for detecting the X position of the chuck table 36 is not limited in form in the present invention.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes Y moving means 38 for moving the second slide block 33 in the Y direction along the guide rails 322. The Y moving means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser processing apparatus 1 includes Y position detecting means (not shown) for detecting the Y position of the chuck table 36. The Y position detecting means includes a linear scale (not shown) extending along one of the guide rails 322 and a read head (not shown) provided on the second slide block 33 and movable along the linear scale together with the second slide block 33 as with the X position detecting means mentioned above. The read head of the Y position detecting means transmits a pulse signal of one pulse every 1 μm in this preferred embodiment to the control means to be hereinafter described. This control means counts the number of pulses as the pulse signal input from the read head to thereby detect the Y position of the chuck table 36. In the case that the pulse motor 382 is used as the drive source for the Y moving means 38 as in this preferred embodiment, the number of pulses as a drive signal output from the control means to the pulse motor 382 may be counted by the control means to thereby detect the Y position of the chuck table 36. In the case that a servo motor is used as the drive source for the Y moving means 38, a pulse signal output from a rotary encoder for detecting the rotational speed of the servo motor may be sent to the control means, and the number of pulses as the pulse signal input from the rotary encoder into the control means may be counted by the control means to thereby detect the Y position of the chuck table 36. Thus, the means for detecting the Y position of the chuck table 36 is not limited in form in the present invention.

The laser beam applying unit 4 includes a support member 41 provided on the stationary base 2, a casing 42 supported by the support member 41 so as to extend in a substantially horizontal direction, laser beam applying means 5 provided on the casing 42, and imaging means 6 provided at a front end portion of the casing 42 for detecting a subject area to be laser-processed. The imaging means 6 includes an ordinary imaging device (charge-coupled device (CCD)) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 6 is transmitted to the control means to be hereinafter described.

The laser beam applying means 5 includes focusing means 51 for focusing a laser beam to the workpiece held on the chuck table 36. Although not shown, the laser beam applying means 5 also includes a pulsed laser oscillator for oscillating a pulsed laser beam at a desired repetition frequency, power adjusting means (attenuator) for adjusting the power of the pulsed laser beam oscillated from the pulsed laser oscillator, and a direction changing mirror for changing the direction of the optical path of the pulsed laser beam toward the focusing means 51.

The laser processing apparatus 1 further includes control means (not shown). This control means is configured by a computer, and it includes a central processing unit (CPU) for performing operational processing according to a control program, a read only memory (ROM) preliminarily storing the control program, a random access memory (RAM) for storing the results of computation etc., an input interface, and an output interface.

There will now be described a wafer processing method to be performed by using the laser processing apparatus 1 shown in FIG. 1 in such a manner that a laser beam is applied to a wafer 10 (see FIG. 2A) along a plurality of crossing division lines formed on the front side of the wafer 10 to thereby divide the wafer 10 into a plurality of SAW devices 11 along the division lines, wherein the wafer 10 is formed from a lithium tantalate ($LiTaO_3$) substrate.

Figure 2A:
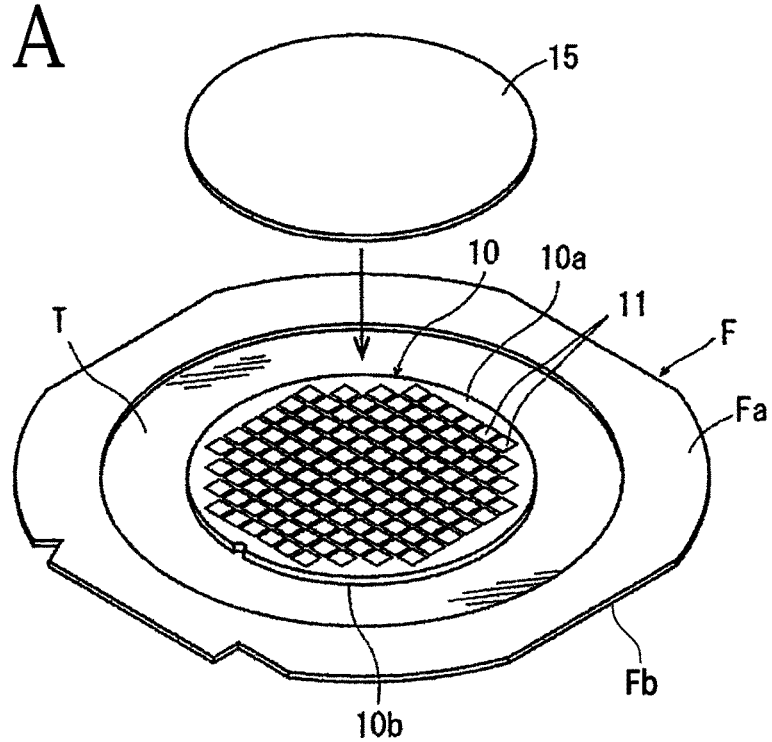
FIG. 2A is a perspective view showing a protective tape attaching step.

Referring to FIG. 2A, the wafer 10 is attached to an adhesive tape T supported to an annular frame F having an inside opening. The wafer 10 has a front side 10a and a back side 10b. The devices 11 are formed on the front side 10a of the wafer 10 so as to be separated by the crossing division lines. The back side 10b of the wafer 10 is attached to the front side (adhesive side) of the adhesive tape T in its central portion exposed to the inside opening of the annular frame F. The annular frame F has a front side Fa and a back side Fb. The peripheral portion of the adhesive tape T is previously attached to the back side Fb of the annular frame F in such a manner that the inside opening of the annular frame F is closed by the adhesive tape T. Accordingly, the wafer 10 is supported through the adhesive tape T to the annular frame F in such a manner that the front side 10a of the wafer 10 and the front side Fa of the annular frame F are oriented upward (frame supporting step). The adhesive tape T may be formed from a soft polyvinyl chloride (PVC) film or a polyolefin (PO) film, for example. However, any material having a property of transmitting a laser beam to be hereinafter described may be adopted as the material of the adhesive tape T.

After performing the frame supporting step, a protective tape 15 as a protective member is attached to the front side 10a of the wafer 10 so as to fully cover the front side 10a as shown in FIG. 2A (protective tape attaching step). The attachment of the protective tape 15 is not necessarily required to follow the frame supporting step. For example, the protective tape 15 may be previously attached to the front side 10a of the wafer 10 before uniting the wafer 10, the adhesive tape T, and the annular frame F. That is, it is only necessary to attach the protective tape 15 to the front side 10a of the wafer 10 at any time before holding the wafer 10 on the chuck table 36 of the laser processing apparatus 1. The protective tape 15 may be formed of PVC or PO, for example, as similar to the material of the adhesive tape T. However, any material having a property of not transmitting a laser beam may also be adopted as the material of the protective tape 15.

Figure 2B:
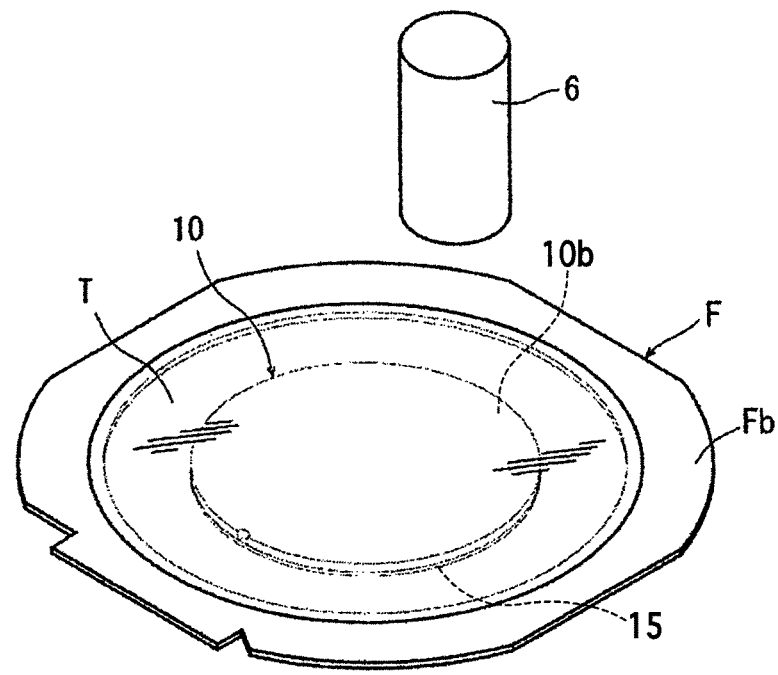
FIG. 2B is a perspective view showing an alignment step.

After performing the protective tape attaching step, the annular frame F is inverted so that the back side Fb of the annular frame F is oriented upward as shown in FIG. 2B, and the wafer 10 is placed on the chuck table 36 in the condition where the protective tape 15 attached to the front side 10a of the wafer 10 is in contact with the upper surface of the vacuum chuck 361. In this condition, the suction means connected to the vacuum chuck 361 is operated to hold the wafer 10 through the protective tape 15 on the vacuum chuck 361 of the chuck table 36 under suction. After holding the wafer 10 on the chuck table 36 as mentioned above, the annular frame F is fixed by the clamps 362. In such a fixed condition, the protective tape 15, the wafer 10, and the adhesive tape T are stacked in this order on the chuck table 36 of the chuck table mechanism 3 (see FIGS. 2B and 3B).

Thereafter, the chuck table 36 holding the wafer 10 is moved to the position directly below the imaging means 6 by operating the X moving means 37. In this condition, an alignment operation is performed in such a manner that the wafer 10 held on the chuck table 36 is imaged by the imaging means 6 to make the crossing division lines of the wafer 10 parallel to the X direction and the Y direction by performing image processing such as pattern matching (alignment step). In imaging the wafer 10, the front side 10a of the wafer 10 on which the division lines are formed is oriented downward. However, since the imaging means 6 includes infrared light applying means for applying infrared light, an optical system for capturing the infrared light, and an imaging device (infrared CCD) for outputting an electrical signal corresponding to the infrared light as mentioned above. Accordingly, the division lines formed on the front side 10a of the wafer 10 can be imaged from the back side 10b of the wafer 10 by applying infrared light from the imaging means 6 to the wafer 10.

By performing the alignment step, the wafer 10 held on the chuck table 36 is positioned at predetermined coordinates, and information on the coordinate position of the wafer 10 is stored into the RAM of the control means.

Figure 3A:
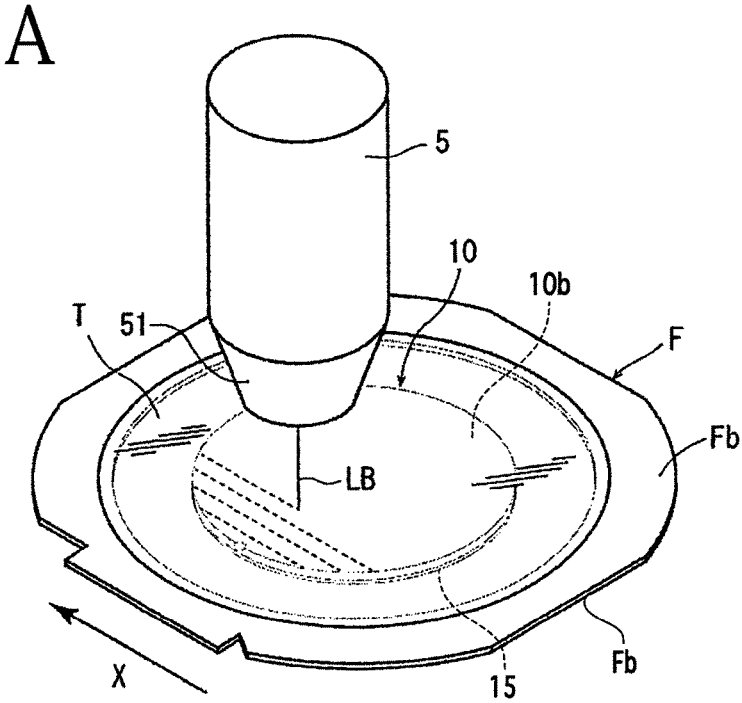
FIGS. 3A to 3C are views for illustrating a shield tunnel forming step.
Figure 3B:
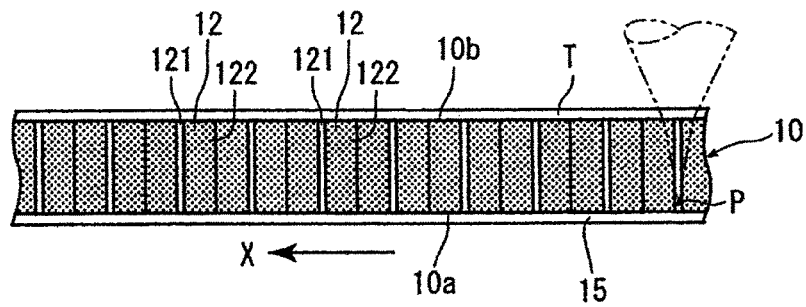

After performing the alignment step, the chuck table 36 is moved to a laser beam applying area where the focusing means 51 of the laser beam applying means 5 for applying a laser beam is located, and one end of a predetermined one of the division lines is positioned directly below the focusing means 51. Thereafter, focal position adjusting means (not shown) is operated to move the focusing means 51 along its optical axis, thereby setting the focal point P of a pulsed laser beam LB to be focused by a focusing lens included in the focusing means 51, wherein the focal point P is set inside the wafer 10 at a desired position in the thickness direction of the wafer 10. More specifically, as shown in FIG. 3B, the focal point P of the pulsed laser beam LB is set inside the wafer 10 at a predetermined position near the front side 10a (lower surface) opposite to the back side 10b (upper surface) to which the pulsed laser beam is applied.

After setting the focal point P of the pulsed laser beam LB at the predetermined position inside the wafer 10, the laser beam applying means 5 is operated to apply the pulsed laser beam LB from the focusing means 51 through the adhesive tape T to the wafer 10, thereby forming a shield tunnel 12 extending from the focal point P set inside the wafer 10 near the front side 10a to the back side 10b where the pulsed laser beam LB is applied (shield tunnel forming step). As shown in FIGS. 3A and 3B, the shield tunnel 12 is composed of a fine hole 121 and an amorphous region 122 for shielding the fine hole 121. More specifically, the pulsed laser beam LB having a transmission wavelength to the adhesive tape T and the wafer 10 is applied from the focusing means 51 to the wafer 10, and at the same time the chuck table 36 is moved in the X direction (shown by an arrow X in FIG. 3A) at a predetermined feed speed. When the other end of the predetermined division line has reached the position directly below the focusing means 51, the application of the pulsed laser beam LB is stopped and the movement of the chuck table 36 is also stopped.

For example, the shield tunnel forming step mentioned above is performed under the following processing conditions.

Figure 3C:
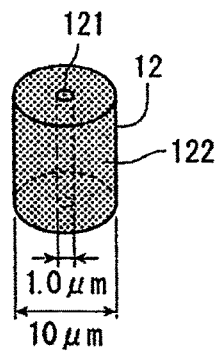

Wavelength: 1030 nm
Average power: 3 W
Repetition frequency: 50 kHz
Pulse width: 10 ps
Spot diameter: 10 µm
Refractive index/numerical aperture (*): 0.05 to 0.2
Work feed speed: 500 mm/second
(*): Refractive index of lithium tantalate/numerical aperture of the focusing lens constituting the focusing means By performing the shield tunnel forming step mentioned above along the predetermined division line, a plurality of fine holes 121 and a plurality of amorphous regions 122 are grown in the wafer 10 so as to extend from the front side 10a (lower surface) where the focal point P of the pulsed laser beam LB is set to the back side 10b (upper surface) as a beam entrance surface as shown in FIGS. 3B and 3C, wherein the amorphous regions 122 are formed around the fine holes 121. As a result, a plurality of amorphous shield tunnels 12 are formed along the predetermined division line at predetermined intervals (e.g., 10 µm intervals) as shown in FIG. 3B. As shown in FIG. 3C, each shield tunnel 12 is composed of the central fine hole 121 having a diameter of about 1 µm and the amorphous region 122 formed around the central fine hole 121 and having a diameter of 10 µm. In this preferred embodiment, the amorphous regions 122 of any adjacent ones of the plural shield tunnels 12 are connected with each other. Each amorphous shield tunnel 12 formed by the shield tunnel forming step mentioned above can be formed so as to extend from the front side 10a (lower surface) of the wafer 10 to the back side 10b (upper surface) as the beam entrance surface. Accordingly, even when the thickness of the wafer 10 is large, it is sufficient to once apply the pulsed laser beam LB along each division line, so that the productivity can be greatly improved. Furthermore, no debris is scattered in the shield tunnel forming step, so that it is possible to solve the problem that the devices may be degraded in quality. After performing the shield tunnel forming step along the predetermined division line as mentioned above, the chuck table 36 is indexed in the Y direction and also rotated 90 degrees to similarly perform the shield tunnel forming step along all of the other division lines.

Figure 4A:
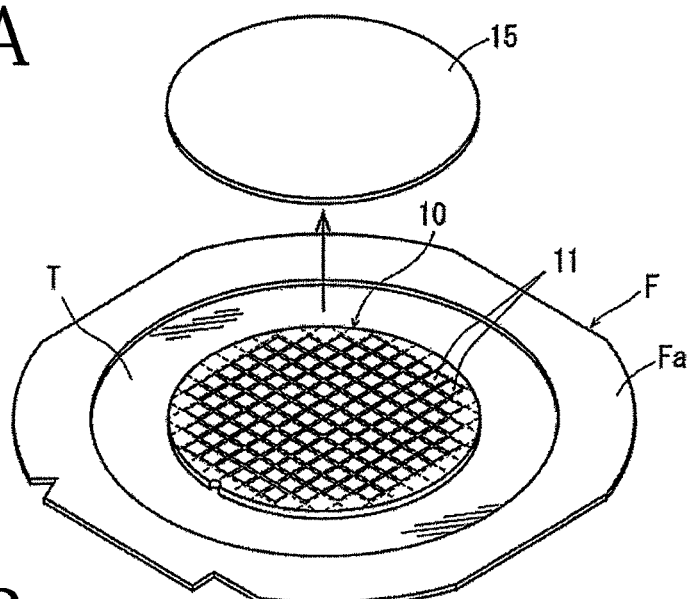
FIG. 4A is a perspective view showing a protective tape peeling step.

After performing the shield tunnel forming step along each division line, the clamps 362 fixing the wafer 10 placed on the chuck table 36 are released, and the operation of the suction means is also stopped to remove the wafer 10 supported through the adhesive tape T to the annular frame F, from the chuck table mechanism 3. Thereafter, as shown in FIG. 4A, the annular frame F is inverted to upward orient the protective tape 15 attached to the front side 10a of the wafer 10. That is, the front side Fa of the annular frame F is oriented upward as shown in FIG. 4A. Thereafter, the protective tape 15 is peeled from the front side 10a of the wafer 10 (protective tape peeling step). Thereafter, the wafer 10 supported through the adhesive tape T to the annular frame F is transferred to dividing means (tape expanding means) 60 shown in FIGS. 4B and 4C to perform a dividing step.

Figure 4B:
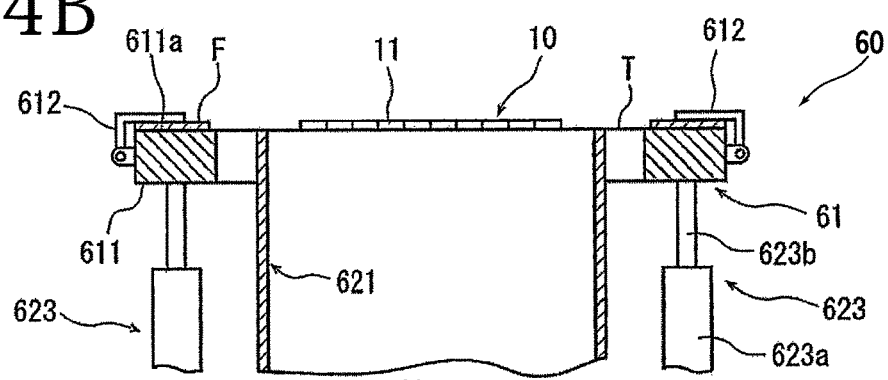
FIG. 4B is a sectional view showing a dividing step.
Figure 4C:
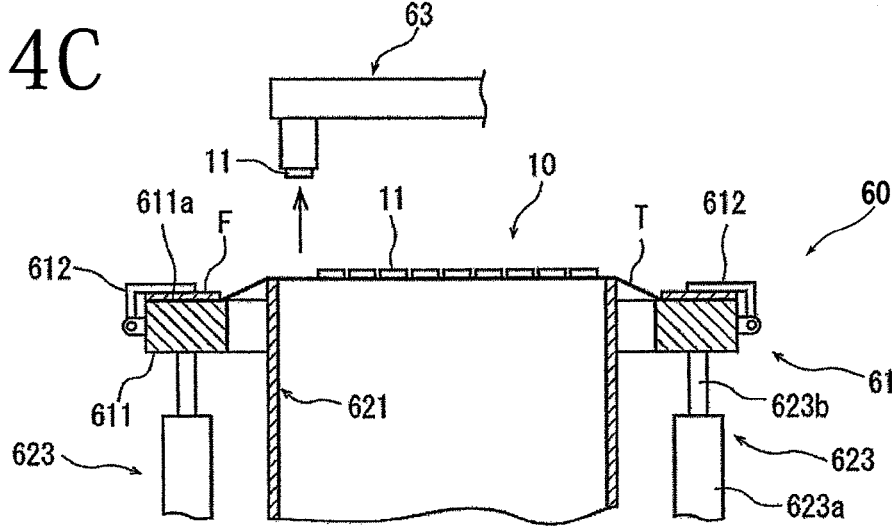
FIG. 4C is a sectional view showing a pickup step.

After performing the protective tape peeling step, the dividing step is performed to divide the wafer 10 into the individual devices 11 (device chips) by expanding the adhesive tape T. The dividing means 60 includes frame holding means 61 for holding the annular frame F supporting the wafer 10 through the adhesive tape T. The frame holding means 61 includes an annular frame holding member 611 having a mounting surface 611a for mounting the annular frame F thereon. A plurality of clamps 612 for clamping the annular frame F are provided on the frame holding member 611. The dividing means 60 further includes a cylindrical expanding drum 621 provided inside the annular frame holding member 611 and supporting means 623 for operatively supporting the frame holding member 611. The supporting means 623 is composed of a plurality of air cylinders 623a for vertically moving the frame holding member 611. In performing the dividing step by using the dividing means 60, the annular frame F supporting the wafer 10 through the adhesive tape T is mounted on the mounting surface 611a of the frame holding member 611 and then fixed to the frame holding member 611 by the clamps 612 as shown in FIG. 4B (frame holding step). At this time, the frame holding member 611 is previously set at a reference position where the mounting surface 611a is at the same level as that of the upper end of the expanding drum 621. Thereafter, the air cylinders 623a are operated to lower the frame holding member 611 to an expansion position shown in FIG. 4C. Accordingly, the annular frame F fixed to the mounting surface 611a of the frame holding member 611 is also lowered, so that the adhesive tape T supported to the annular frame F comes into abutment against the upper end of the expanding drum 621 and is expanded as shown in FIG. 4C. As a result, a tensile force radially acts on the wafer 10 attached to the adhesive tape T. Accordingly, the wafer 10 is divided into the individual devices 11 along each division line where the plural shield tunnels 12 are continuously formed to be reduced in strength. At the same time, a spacing is formed between any adjacent ones of the individual devices 11 (dividing step). The protective tape peeling step mentioned above may be performed at any time before expanding the adhesive tape T in the dividing step. For example, the protective tape peeling step may be performed after holding the annular frame F on the frame holding member 611.

Thereafter, a pickup collet 63 shown in FIG. 4C is operated to hold each device 11 (device chip) under suction and peel it from the adhesive tape T, thereby individually picking up the devices 11 (device chips) (pickup step). Each device 11 is next transferred to any means for performing a die bonding step. In the pickup step, each device 11 can be easily picked up without the contact with its adjacent device 11 because the spacing is formed between any adjacent ones of the individual devices 11 attached to the adhesive tape T.

As described above, the wafer processing method of the present invention includes a frame supporting step of attaching the back side of a wafer to an adhesive tape supported at its peripheral portion to an annular frame having an inside opening in such a manner that the wafer is set in the inside opening closed by the adhesive tape, thereby supporting the wafer through the adhesive tape to the annular frame. The frame supporting step is followed by a shield tunnel forming step of holding the wafer on a chuck table in the condition where the front side of the wafer faces the upper surface of the chuck table, and next applying a laser beam through the adhesive tape to the back side of the wafer in an area corresponding to each division line in the condition where the focal point of the laser beam is set inside the wafer near the front side thereof, the laser beam having a transmission wavelength to the wafer and the adhesive tape, thereby forming a plurality of shield tunnels arranged along each division line, each shield tunnel extending from the front side of the wafer to the back side thereof, each shield tunnel being composed of a fine hole and an amorphous region formed around the fine hole for shielding the fine hole. Accordingly, even in the case that any member interfering with the laser beam is provided on each division line formed on the front side of the wafer or at a position adjacent to each division line, the shield tunnel forming step can be performed without being affected by the presence of such an interfering member. Further, the laser beam is applied through the adhesive tape to the back side of the wafer in the shield tunnel forming step, wherein the adhesive tape is previously attached to the back side of the wafer. Accordingly, in the pickup step to be performed after dividing the wafer, the individual devices can be picked up from the adhesive tape T in the condition where the front side of the wafer is oriented upward, or exposed. That is, in transferring the devices picked up to any means for performing a die bonding step or the like, it is unnecessary to perform a step of inverting each device, so that a reduction in production efficiency can be eliminated.

The present invention is not limited to the above preferred embodiment, but various modifications may be made. For example, while a lithium tantalate ($LiTaO_3$) substrate is used as the workpiece in this preferred embodiment, the workpiece usable in the present invention may be selected from any other substrates such as SiC substrate, Si substrate, gallium nitride substrate, and sapphire substrate. Further, while the protective tape is attached to the front side of the wafer before performing the shield tunnel forming step and the wafer is held through the protective tape on the chuck table in the above preferred embodiment, the protective tape is not necessarily required. In the case that a protective film is formed on the front side of the wafer, the protective tape may be omitted. Further, while the wafer is divided by expanding the adhesive tape in the dividing step and the individual devices divided from each other are picked up in the pickup step in the above preferred embodiment, any other methods may be adopted. For example, an external force may be applied to the wafer along each division line to thereby divide the wafer into the individual devices in the dividing step. Thereafter, ultraviolet light may be applied to the adhesive tape to thereby lose the adhesion of the adhesive tape in performing the pickup step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual device chips along a plurality of crossing division lines, a front side of said wafer being partitioned by said division lines to define a plurality of separate regions where a plurality of devices corresponding to said device chips are formed, said wafer processing method comprising:

a frame supporting step of attaching a back side of said wafer to an adhesive tape supported at its peripheral portion to an annular frame having an inside opening in such a manner that said wafer is set in said inside opening closed by said adhesive tape, thereby supporting said wafer through said adhesive tape to said annular frame; and a shield tunnel forming step of holding said wafer on a chuck table in a condition where the front side of said wafer faces an upper surface of said chuck table after performing said frame supporting step, and next applying a laser beam through said adhesive tape to the back side of said wafer in an area corresponding to each division line, said laser beam having a transmission wavelength to said wafer and said adhesive tape, thereby forming a plurality of shield tunnels arranged along each division line, each shield tunnel extending from the front side of said wafer to the back side thereof, each shield tunnel being composed of a fine hole and an amorphous region formed around said fine hole for shielding said fine hole, where each fine hold extends from the front side of said wafer to the back side thereof.

2. The wafer processing method according to claim 1, further comprising:
  a dividing step of expanding said adhesive tape after performing said shield tunnel forming step, thereby dividing said wafer into said individual device chips.

3. The wafer processing method according to claim 2, further comprising:
  a protective member providing step of providing a protective member on the front side of said wafer before performing said frame supporting step;
  said protective member being peeled from the front side of said wafer before expanding said adhesive tape in said dividing step.

4. A wafer processing method for dividing a wafer into individual device chips along a plurality of crossing division lines, a front side of said wafer being partitioned by said division lines to define a plurality of separate regions where a plurality of devices corresponding to said device chips are formed, said wafer processing method comprising:
  a frame supporting step of attaching a back side of said wafer to an adhesive tape supported at its peripheral portion to an annular frame having an inside opening in such a manner that said wafer is set in said inside opening closed by said adhesive tape, thereby supporting said wafer through said adhesive tape to said annular frame; and
  a shield tunnel forming step of holding said wafer on a chuck table in a condition where the front side of said wafer faces an upper surface of said chuck table after performing said frame supporting step, and next applying a laser beam through said adhesive tape to the back side of said wafer in an area corresponding to each division line, said laser beam having a transmission wavelength to said wafer and said adhesive tape, thereby forming a plurality of shield tunnels arranged at predetermined intervals along each division line, each shield tunnel extending in a direction between the front side of said wafer and the back side thereof, each shield tunnel being composed of a fine hole and an amorphous region formed around said fine hole for shielding said fine hole, wherein each fine hole extends in the direction between the front side of said wafer and the back side thereof.

5. The wafer processing method according to claim 4, wherein the predetermined intervals are each 10 µm.

6. The wafer processing method according to claim 4, wherein each shield tunnel extends from the front side of said wafer to the back side thereof.

7. The wafer processing method according to claim 4, further comprising:
  a dividing step of expanding said adhesive tape after performing said shield tunnel forming step, thereby dividing said wafer into said individual device chips.

8. The wafer processing method according to claim 7, further comprising:
  a protective member providing step of providing a protective member on the front side of said wafer before performing said frame supporting step;
  said protective member being peeled from the front side of said wafer before expanding said adhesive tape in said dividing step.

* * * * *